(12) United States Patent
Strutz et al.

(10) Patent No.: US 7,235,873 B2
(45) Date of Patent: Jun. 26, 2007

(54) PROTECTIVE DEVICE FOR SUBASSEMBLIES AND METHOD FOR PRODUCING A PROTECTIVE DEVICE

(75) Inventors: Volker Strutz, Tegernheim (DE); Uta Gebauer, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/210,218

(22) Filed: Aug. 1, 2002

(65) Prior Publication Data
US 2003/0024735 A1   Feb. 6, 2003

(30) Foreign Application Priority Data
Aug. 1, 2001   (DE) ................ 101 37 666

(51) Int. Cl.
H01L 23/02 (2006.01)
H01L 23/28 (2006.01)
H01L 23/29 (2006.01)
H01L 21/00 (2006.01)
H01L 21/66 (2006.01)

(52) U.S. Cl. ............... 257/704; 257/678; 257/787; 257/788; 438/15; 438/25; 438/26; 438/51; 438/55; 438/64; 438/106; 438/112; 438/124; 438/126; 438/127

(58) Field of Classification Search ........... 257/704, 257/787, 710, 777, 783, 609, 678; 361/742, 361/770
See application file for complete search history.

(56) References Cited

U.S. PATENT DOCUMENTS 4,009,564 A * 3/1977 Zurcher ............ 368/204
H000073 H * 6/1986 Claasen et al. ............ 257/669
4,658,331 A * 4/1987 Berg ............ 361/705
4,816,896 A * 3/1989 Owens ............ 206/726
5,033,970 A * 7/1991 Buchoff ............ 439/66
5,134,462 A * 7/1992 Freyman et al. ............ 257/688

(Continued)

FOREIGN PATENT DOCUMENTS

DE   196 49 798 A1   6/1998

(Continued)

OTHER PUBLICATIONS

Jaimal Williamson,"Wafer Level Batch Package (WLBP): Incorporation of Air Pores/Foams in a Polyimide Matriz Using Low Modulus Sacrificial Commercial Polymer", 2000 International Symposium on Advanced Packaging Materials, p. 319-322.*

(Continued)

*Primary Examiner*—Carl Whitehead, Jr.
*Assistant Examiner*—James M. Mitchell
(74) *Attorney, Agent, or Firm*—Laurence A. Greenberg; Werner H. Stemer; Ralph E. Locher

(57) ABSTRACT

A protective device for subassemblies having a substrate and at least one component to be protected which is disposed on the substrate includes at least one covering element for covering a subassembly. An expanded filler material fills at least one given space between the substrate and the covering element and provides protection against mechanical compression. A method of producing a protective device is also provided. An expandable material is applied to the substrate and is expanded after the covering element has been mounted.

12 Claims, 1 Drawing Sheet

U.S. PATENT DOCUMENTS

| | | | | |
|---|---|---|---|---|
| 5,159,530 | A | * | 10/1992 | Komoto ................... 361/715 |
| 5,230,759 | A | * | 7/1993 | Hiraiwa ................... 156/69 |
| 5,355,016 | A | * | 10/1994 | Swirbel et al. ............. 257/659 |
| 5,358,412 | A | * | 10/1994 | Maurinus et al. ............ 439/66 |
| 5,435,876 | A | * | 7/1995 | Alfaro et al. ............... 156/247 |
| 5,461,256 | A | * | 10/1995 | Yamada et al. ............. 257/679 |
| 5,499,164 | A | * | 3/1996 | Hill-Lindsay et al. ....... 361/785 |
| 5,827,999 | A | * | 10/1998 | McMillan et al. .......... 174/52.4 |
| 5,935,314 | A | * | 8/1999 | Higuchi et al. ............. 106/400 |
| 5,960,260 | A | * | 9/1999 | Umehara et al. ........... 438/118 |
| 6,030,856 | A | * | 2/2000 | DiStefano et al. ........... 438/117 |
| 6,075,289 | A | * | 6/2000 | Distefano ................... 257/707 |
| 6,147,401 | A | * | 11/2000 | Solberg ..................... 257/723 |
| 6,166,434 | A | * | 12/2000 | Desai et al. ................. 257/704 |
| 6,300,155 | B1 | * | 10/2001 | Taki et al. .................... 438/52 |
| 6,359,335 | B1 | * | 3/2002 | Distefano et al. ........... 257/707 |
| 6,359,343 | B1 | * | 3/2002 | Langari et al. ............. 257/789 |
| 6,373,703 | B2 | * | 4/2002 | Johnson et al. ............. 361/704 |
| 6,403,387 | B1 | * | 6/2002 | Wensel ........................ 438/15 |
| 6,404,049 | B1 | * | 6/2002 | Shibamoto et al. ......... 257/712 |
| 6,432,749 | B1 | * | 8/2002 | Libres ........................ 438/122 |
| 6,501,183 | B2 | * | 12/2002 | Kanemoto et al. .......... 257/777 |
| 6,504,096 | B2 | * | 1/2003 | Okubora ................... 174/52.2 |
| 6,534,858 | B2 | * | 3/2003 | Akram et al. ............... 257/706 |
| 6,614,108 | B1 | * | 9/2003 | Sanftleben et al. ......... 257/710 |
| 6,627,997 | B1 | * | 9/2003 | Eguchi et al. .............. 257/777 |
| 6,750,551 | B1 | * | 6/2004 | Frutschy et al. ............ 257/785 |
| 6,791,170 | B1 | * | 9/2004 | Fuku et al. .................. 257/678 |
| 6,822,340 | B2 | * | 11/2004 | Lamson et al. ............. 257/790 |
| 2001/0007370 | A1 | * | 7/2001 | Distefano ................... 257/696 |
| 2001/0008283 | A1 | * | 7/2001 | King et al. ................... 257/48 |
| 2002/0109219 | A1 | * | 8/2002 | Yang et al. .................. 257/712 |
| 2002/0115236 | A1 | * | 8/2002 | Fjelstad et al. ............. 438/125 |
| 2002/0195704 | A1 | * | 12/2002 | Chan et al. .................. 257/724 |
| 2004/0036162 | A1 | * | 2/2004 | Chuang et al. ............. 257/717 |
| 2004/0037059 | A1 | * | 2/2004 | Stiborek et al. ............ 361/764 |

FOREIGN PATENT DOCUMENTS

| | | | |
|---|---|---|---|
| DE | 198 28 489 A1 | | 3/1999 |
| DE | 198 05 785 C1 | | 6/1999 |
| DE | 199 42 915 A1 | | 3/2001 |
| EP | 000097087 | * | 12/1983 |
| EP | 1 093 159 A1 | | 4/2001 |
| JP | 358057871 | * | 4/1983 |
| JP | 62249458 | * | 10/1987 |
| JP | 362249458 | * | 10/1987 |
| JP | 2000299396 A | | 10/2000 |

OTHER PUBLICATIONS

Jeff Labadie, "Nanopore Foams of High Temperature Polymers", 1992 IEEE, p. 925-930.*

IBM techical disclosure, "Foamed Thermoset and Thermoplastic Polymer", May 1966.*

* cited by examiner

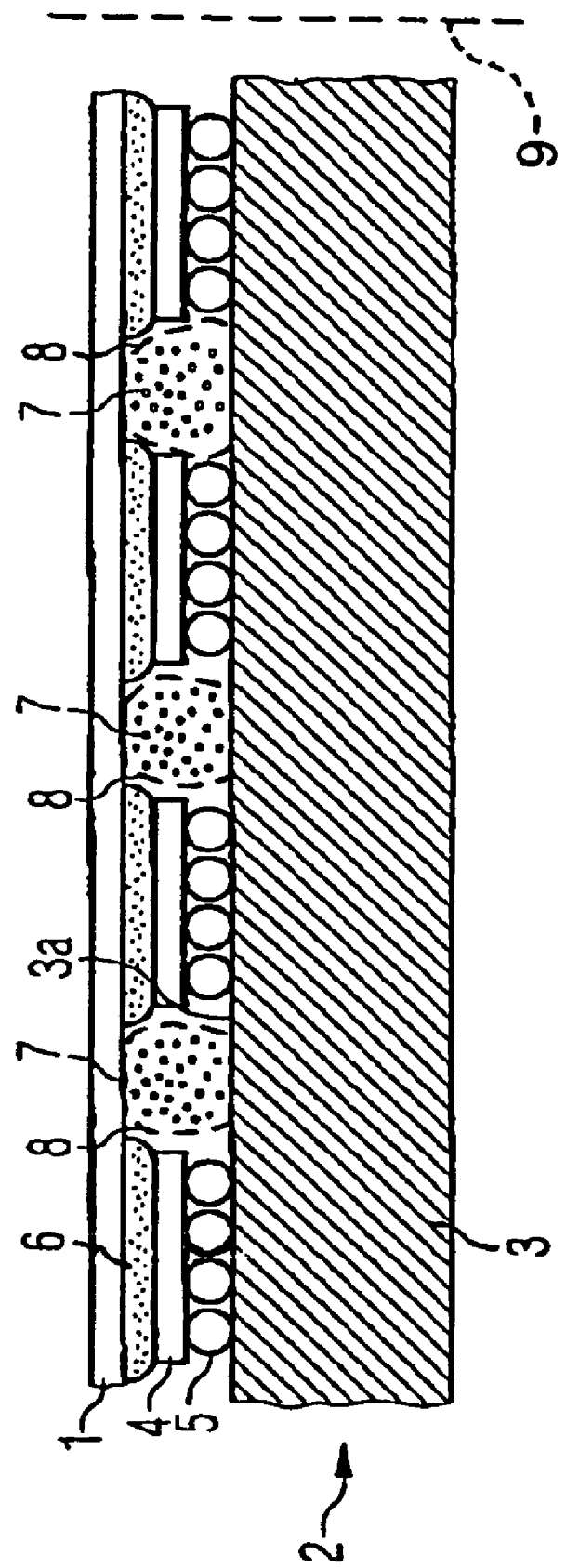

PROTECTIVE DEVICE FOR SUBASSEMBLIES AND METHOD FOR PRODUCING A PROTECTIVE DEVICE

BACKGROUND OF THE INVENTION

FIELD OF THE INVENTION

The present invention relates to a protective device for subassemblies, for example subassemblies with electronic components. The invention also relates to a method of producing a protective device for subassemblies.

When using integrated semiconductor circuits, also known as chips, that is to say platelets based on silicon or gallium arsenide and cut out of a wafer with electric components produced photolithographically or by similar methods on its surface, the task of effective protection against mechanical and/or chemical influences needs to be solved. This task is often solved by introducing the chip into a housing, which is normally produced from plastic. However, a problem in the chip mounting is the reaction of the electrical contacts between the chip and a substrate accommodating the chip, such as a circuit board, to the action of forces on the chip. In the event of displacement of the component or else in the event of direct action on the contact elements, the latter can be damaged. As a result of the use of housings, in this case the problem is merely shifted from the actual chip contacts (for example thin wires or contact elements similar to balls, ball grid arrays) to the contacts of the housing, even though the latter can normally be more highly loaded mechanically. In principle, however, there remains the problem that the contact elements have too low a resistance against forces acting on the component, for example the chip.

In recent times, for fabrication reasons and also for reasons concerned with space, economy and rationalization, use has increasingly been made of so-called flip-chips. These are integrated semiconductors which are fixed directly to the substrate, that is to say the circuit board, without a housing and contacted electrically. For this purpose, the individual chips still in the wafer composite are provided with suitable flexible contacts and, after the wafer has been cut up, are placed on the substrate with the contact side down. In order to permit testing of the flip-chips before they are used, customary test devices are used. In order to be able to use such test devices on the wafer, the contacts have to be configured to be sufficiently compliant so that they are able to compensate for tilting between the surface of the wafer in the area of the flip-chip to be tested and the test device. However, after the flip-chip has been mounted on the substrate, this necessary compliance gives rise to corresponding mechanical sensitivity and leads to an increased need for protective measures.

A further development in recent times has been microcircuit boards, as they are known, in which a plurality of chips are applied to the microcircuit board substrate with the structured sides upward and are connected to the conductor track structures of the microcircuit boards through the use of wire bonding. Here, too, protection of the chips and in particular of the contact wires as well against mechanical effects is desirable.

In the case of conventional fixing of a mechanical protective element such as a cover onto a substrate, such as is carried out by riveting, because of the tolerances of the substrate, the receiving holes for the rivets and the protective element, a movement of this protective element in the X- and Y-direction, that is to say parallel to the plane of the substrate, is possible even after mounting. However, in microelectronics it is generally usual and desirable continually to reduce the dimensions of components. For this reason, the underside of the coverings comes closer and closer to the actual chips, which can lead to the mechanical problems described above. In particular in the case of sensitive components with flexible interconnect elements, this can lead to damage to the component.

Such a protective element is generally also used as a heat spreader. Here, the components located underneath, for example semiconductor components are coupled mechanically and thermally to a thermally conductive material, the so-called "gap filler," on the protective element. A gap filler can include silicon, for example, and can contain a proportion of metals or metal oxides. As a result, movement of the heat spreader is transmitted directly to the components. If the movement of the protective element is too great, damage in the electrical connections can occur and can lead to failure of components. As a result of the often low inherent stiffness of the protective element, protection of the components located underneath against compression in the Z-direction is additionally likewise not ensured.

In the prior art, a solution to the problem of the unintentional movement of the protective element has been proposed, in which the protective element is joined to the substrate through the use of very accurately fitting riveted connections. This has the disadvantage that the selection of suitable rivets is very restricted and/or a high degree of accuracy of substrate and covering has to be provided. Other fixing variants which could ensure good fixing often cannot be implemented because of the dimensional relationships of a subassembly or the surroundings into which this subassembly is to be integrated.

A further possibility is to bond the covering adhesively to the substrate. However, this results in an additional process step and therefore increases the costs. Compression protection in the Z-direction has hitherto not been carried out or only by supporting the components in the Z-direction, such as through the use of a full or partial underfill under the components, which projects as far as under the components-but requires a great deal of work and is subject to faults.

SUMMARY OF THE INVENTION

It is accordingly an object of the invention to provide a protective device for subassemblies which overcomes the above-mentioned disadvantages of the heretofore-known devices of this general type and with which a displacement of the covering in the X- and/or Y-direction, but preferably also in the Z-direction, that is to say at right angles to the plane of the substrate, is prevented or at least reduced to such an extent that damage to the contacts or to the components to be protected can be prevented.

With the foregoing and other objects in view there is provided, in accordance with the invention, a module, including:
a subassembly including a substrate and a component to be protected, the component being disposed on the substrate;
a protective device for the subassembly;
the protective device including a covering element for covering the subassembly such that a given space is formed between the substrate and the covering element;
the protective device including an expanded filler material for filling the given space between the substrate and the covering element; and
the substrate having a surface, the given space being located such that the expanded filler material prevents a displacement of the component to be protected in a direction perpendicular to the surface of the substrate in case of a compression of the covering element.

The invention is based on the basic idea of filling cavities between the substrate and the covering with a filler material, in order in this way to restrict or totally prevent the movement of the covering without further measures.

Accordingly, the invention is firstly concerned with a protective device for subassemblies having a substrate and at least one component arranged thereon and to be protected, which includes:

at least one covering element for covering at least one subassembly; and an expanded filler material, which fills one or more predefined spaces between the substrate and the covering element.

In other words, with the objects of the invention in view there is provided, in combination with a subassembly having a substrate with a surface and having a component to be protected disposed on the substrate, a protective device for the subassembly, including:

a covering element for covering the subassembly such that a given space is defined between the substrate and the covering element;

an expanded filler material for filling the given space between the substrate and the covering element; and the given space being provided such that the expanded filler material prevents a displacement of the component to be protected in a direction perpendicular to the surface of the substrate in case of a compression of the covering element.

In this case, a subassembly is to be understood to mean an end product of a configuration including a substrate and one or more functional components. A substrate can be a circuit board made of polymers in the conventional sense, but also a ceramic or metal support on which the components are placed, for example semiconductor components such as integrated circuits or passive components such as resistors, coils, etc.

A covering element in the sense of the present invention is, for example, an element which covers the subassembly in the manner of a cover. The covering element can have one or more (for example offset vertically in relation to each other) substantially planar areas to cover the components. These constitute the main areas of the covering element and, in terms of their function, substantially correspond to the covers known in the prior art. The covering element according to the invention can be prepared from various materials used in the prior art. For example, it is possible to bend or fabricate the covering element from metals such as steel, copper or aluminum sheet, but it can also be possible to press, cast or otherwise mold the covering element according to the invention from a polymer.

The components to be protected can be of an extremely wide variety. For example, they can be electromechanical or purely mechanical components. One important area of use for the present invention will, however, be in the area of electronics and semiconductor technology, where integrated circuits having a large number of contacts led to the outside have to be protected. It is therefore preferred in particular for the at least one component to be protected to be a circuit component, in particular a semiconductor component, connected to electrical contacts. Here, a circuit component is to be understood to mean any integrated circuit with contacts, be it a housed or unhoused chip. Passive components can also fall under the term circuit components, if they need protection. In addition, the substrate can have conductor tracks or structures like conductor tracks in order to carry electric currents away from the circuit components, if the contacts of the various circuit components are alternatively not directly connected to one another, for example through the use of the use of wire bonds.

A given space or predefined space in the sense of the invention is to be understood to mean a three-dimensional element or its outer circumference, which is or will be or is to be filled with the filler material.

A filler material in the sense of the invention is to be understood to mean any material which is capable of filling a space compactly and which has a certain compressibility and which is capable of distributing a mechanical effect in terms of its force in such a way that no excessive force is exerted on one of the components to be protected.

For this purpose, the filler material can be porous, for example. It is particularly preferred for the filler material to be a foamed polymer. Foams considered are all those materials which are familiar to those skilled in the art, such as closed-cell, mixed-cell or open-cell foams, syntactic foams, thermoplastic or thermosetting foams. Polymers considered are, for example, polystyrene, polyvinyl chloride, polyurethane, urea polymers, polyethylene, or melamine polymers. Because of their suitability for use at higher temperatures, special polyether sulfones and phenolpolymers are preferred. The filler material used must of course be matched to the specified intended application. In this case, it is necessary in particular to take account of the compression or shear forces to be expected on the subassembly to be protected, temperatures during use or in subsequent fabrication steps, chemical resistance and aging behavior of the filler material.

It is preferred in particular for the filler material to be a material expanded in situ. This is understood to mean a material which is only given its expanded properties, that is to say its properties as a foamed polymer, after a starting material has been introduced into the area in which a predefined space has been defined. It is therefore also to be understood to mean that the material is matched particularly well to the physical conditions at the site of the expansion.

In order, for example, to secure components to be protected against compression in the Z-direction as well, it can further be preferred for the filler material to extend as far as under the at least one component.

Although it is in principle possible to leave a free space between a predefined space which is filled with filler material and either substrate or covering element, the free space having dimensions such that, in the event of compression of the covering element in the direction of the substrate, an opposing pressure can be exerted at the right time by the filler material in the predefined space, and therefore direct mechanical contact between the covering element and the component to be protected can be prevented or at least reduced to the level at which there is no longer any risk to the components to be protected or the contacts, but it is preferred for at least one of the predefined spaces to extend from the substrate as far as the covering element, in order in this way to obtain the earliest possible action of the filler material with respect to compression or other displacements of the covering element.

Furthermore, use can be made of synergistic effects in the use of a plurality of predefined spaces which are filled with filler material. For example, the predefined spaces can be arranged in such a way that they prevent displacement of the components in the Z-direction in the event of compression of the covering element. A plurality of predefined spaces can also be arranged in such a way that they can prevent displacement of components to be protected in the X-and/or Y-direction.

The protective device according to the invention can, furthermore, include a gap filler which is arranged between the covering elements and at least one component to be protected. The gap filler fulfills the functions already known in the prior art, for example the diffusion of heat from the components to be protected to the covering element. The gap filler is a plastic compound which, for example as a result of the admixture of metal or metal oxide particles or the like, exhibits good thermal conductivity and which dissipates the heat, developed by the current flowing in semiconductor components, to the covering element. As already explained above, such covering elements often likewise contribute to the dissipation of heat (heat spreaders).

The components that can be protected with the invention can in principle be all components that are known in the prior art or are novel, provided they need appropriate protection, in particular in an X/Y-direction, that is to say parallel to the substrate surface. For example, the at least one component can be a housed component or a flip-chip.

Through the use of the use of an expanded material, it will be possible in many cases to produce a permanent joint between the subassembly and the covering element, since the covering element is fixed by the filler material, for example by its specific shaping or by friction.

Additionally or alternatively, the protective device according to the invention can include fixing elements with which the covering element is fixed to the substrate. These fixing elements can preferably be rivets. However, because of the measure according to the invention, in this case it is also possible to use more cost-effective rivets which have a lower fitting accuracy than the rivets needed hitherto in order to achieve reliable protection.

The substrate can have any form and function known in the prior art. The substrate is preferably a circuit board with contact points to make contact with semiconductor components to be protected. However, it can also be a microcircuit board or a ceramic carrier for corresponding elements. The contact points will normally lie on the circuit board or microcircuit board. However, it is also conceivable for there to be direct wire connections between different semiconductor components, and for the substrate merely to serve as a mechanical holder for the various semiconductor components. In this case, the invention is primarily directed to the protection of the wiring elements, since they constitute the most sensitive part of the subassembly to be protected. In particular, the substrate can be a circuit board having conductor tracks and contacts for connection to the at least one semiconductor component.

The invention is likewise concerned with a method. All that has been stated above, including the advantages and details, applies to the same extent to the method, so that reference is made to the content in its entirety, exactly as, conversely, all that has been stated with respect to the method is intended also to apply appropriately to the protective device according to the invention.

With the objects of the invention in view there is also provided, a method of producing a protective device for a subassembly, the method includes the steps of:
providing a subassembly having a substrate and at least one component to be protected, the at least one component being disposed on the substrate;
applying at least a given quantity of an expandable material to given areas of the subassembly;
placing a covering element on the subassembly; and
expanding the expandable material such that the expandable material fills given spaces between the subassembly and the covering element.

In other words, the invention is concerned with a method of producing a protective device for subassemblies having a substrate and at least one component arranged thereon and to be protected, including the following steps:
providing a subassembly;
applying at least a predefined quantity of an expandable material to predefined areas of the subassembly;
applying a covering element to the subassembly; and
expanding the expandable material so that it fills predefined spaces between the subassembly and the covering element.

As already stated with respect to the device, the predefined spaces can be arranged in such a way that they can prevent displacement of components to be protected in the Z-direction in addition to the X/Y-direction, a plurality of predefined spaces being able to prevent the displacement in the X/Y-direction.

The expansion of the expandable material can be carried out by various methods, for example by heating, radioactive irradiation, automatic expansion after a predefined time or by reducing the pressure of a fluid surrounding the components.

Expansion after a predefined time is normally carried out by adding a catalyst or a reactant to the expandable material which, following a latency time, generates the gas needed for the expansion.

In quite general terms, it is possible to state that the cells in the polymer matrix, if a polymer is used, which forms expanded cells are produced with the aid of propellants. Physical propellants, as they are known, can be used for the expansion. Frequently used for this purpose are easily evaporated hydrocarbons, for example pentane to heptane, chlorinated hydrocarbons such as methyl chloride or trichloroethylene. These hydrocarbons evaporate when heated and form the expanded cells.

Chemical propellants can also be used, which are often solids which decompose at higher temperatures, liberating the gases. Examples of such chemical propellants are azo compounds and sulfonyl hydrazide, which give off nitrogen at temperatures between 90 and 275° C.

In a further variant, substances can be added to the expandable material which remain dissolved in the latter only under a positive pressure and are liberated again when the pressure is reduced, in order to form the cases of the expanded material. For this purpose, adaptations to the production process of the subassemblies and protective devices are necessary in order, if appropriate, to assemble these under positive pressure. In this case, the elements processed are surrounded by a fluid, for example a gas such as air or a liquid, with which the necessary pressure changes can be achieved. As rule, operations are simply carried out in a compressed-air environment.

In order to fill the predefined spaces with filler material, the quantity of expanded material consequently has to be matched to the predefined space and the expansion capability of this filler material. For this purpose, prior calculations are needed, whose result then predefines the quantity of expandable material which is, respectively applied to the substrate in the area where the predefined space which is to be filled is positioned.

In order to achieve a better controlled expansion, it may further be preferred to place molds on the substrate, into which the expandable material is put and which can define the final shape of the predefined space exactly. Such molds can be produced, for example, from a lightweight material such as paper or a polymer film.

In specific applications, it is also possible for the predefined space to be the entire cavity available between substrate and covering element. In this case, the semiconductor components are enclosed completely by the expanded material. As a result of the ability of the expanding material to flow during expansion, the expansion can find its limits, for example, at the contacts or at narrow points between semiconductor components and covering element. Taking such effects and their consequences into account for the desired stabilization according to the invention can be estimated by those skilled in the art.

Other features which are considered as characteristic for the invention are set forth in the appended claims.

Although the invention is illustrated and described herein as embodied in a protective device for subassemblies and a method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description, of specific embodiments when read in connection with the accompanying drawing.

BRIEF DESCRIPTION OF THE DRAWING:

The single FIGURE is a partial sectional view of a subassembly with a covering element and an expanded material according to the invention.

DESCRIPTION OF THE PREFERRED EMBODIMENTS:

Referring now to the single figure, a specific, non-limiting exemplary embodiment of the invention is explained. The single figure illustrates a subassembly with a covering element and an expanded material according to the invention.

By applying a material which is subsequently expanded, for sample by the action of heat, to the substrate between components and/or under the components, the protective element/covering element can be fixed to the substrate, or the components can be prevented from moving in the X/Y-direction and, if appropriate, the Z-direction. In this case, the fixing of the protective element through the use of further standard mechanisms, such as rivets, can be carried out with greater tolerances. Through the use of a material that has expanded subsequently, as opposed to the classical underfill, the material volume does not have to be dispensed so exactly, since the material adapts or adjusts only subsequently. In selecting the expandable material, care must be taken that it is matched to the components during expansion, does not exert any force, does not damage the components and, after expansion has been carried out, is rigid enough to ensure effective protection in the X/Y-direction and, if appropriate, the Z-direction. Further factors can play a part in the choice of suitable materials, for example their porosity and therefore moisture permeability.

FIG. 1 shows a subassembly 2 in cross section, above which there is a covering element 1. The subassembly 2 includes the substrate 3, components such as the semiconductor component 4, contacts, for example bumps 5, as they are known, and possibly a gap filler 6 arranged between the semiconductor component 4 and covering element 1 and serving to spread heat. Arranged between the individual semiconductor components is the expanded material 7 which, in the example shown, fills the space between the surface 3a of the substrate and covering element 1 and between the respectively adjacent semiconductor components 4 to the greatest possible extent. However, it goes without saying that variations of the space 8 predefined here are also possible, which, for example, can be located only between specific semiconductor components or do not completely fill the space available between the semiconductor components, substrate surface 3a and covering element 1. Fixing elements such as rivets are used for fixing the covering element 1 to the substrate 3. A rivet 9 is schematically indicated as a dashed line in the single figure.

The present invention permits effective damping of mechanical effects on components to be protected belonging to subassemblies covered by covering elements, both in the lateral and in the vertical direction. The expanded material is simple to handle and can be positioned in the desired areas through the use of techniques which are known and well understood.

We claim:

1. A module, comprising:
   a subassembly including a substrate and a component to be protected, said component being disposed on said substrate;
   a protective device for said subassembly;
   said protective device including a covering element for covering said subassembly;
   said protective device including an expanded filler material having a certain compressibility and extending from said substrate as far as said covering element;
   said filler material being separated from said component to be protected;
   said filler material including substances dissolved in said filler material under a positive pressure and liberated again when the pressure is reduced for surrounding the component to be protected with a fluid to achieve necessary pressure changes, and said filler material being a foamed polymer; and
   said substrate having a surface, said expanded filler material being located on said surface to prevent an excessive force from being exerted to said component to be protected.

2. The module according to claim 1, wherein:
   said subassembly includes electrical contacts; and
   said component to be protected is a circuit component connected to said electrical contacts.

3. The module according to claim 2, wherein said circuit component is a housed component.

4. The module according to claim 2, wherein said circuit component is a flip-chip.

5. The module according to claim 2, wherein said substrate is a circuit board having conductor tracks and contacts connected to said circuit component.

6. The module according to claim 1, wherein said component is a semiconductor component.

7. The module according to claim 1, wherein said foamed polymer contains a material selected from the group consisting of polystyrene, polyvinyl chloride, a polyurethane, a urea polymer, polyethylene, a melamine polymer, a polyether sulfone and a phenol polymer.

8. The module according to claim 1, wherein said filler material is a material expanded in situ.

9. The module according to claim 1, wherein said filler material extends as far as under said component to be protected.

10. The module according to claim 1, wherein said protective device includes a gap filler disposed between said covering element and said component to be protected.

11. The module according to claim 1, wherein said protective device includes fixing elements for fixing said covering element to said substrate.

12. In combination with a subassembly having a substrate with a surface and having a component to be protected disposed on the substrate, a protective device for the subassembly, comprising:

a covering element for covering the subassembly;
an expanded filler material having a certain compressibility and extending from the substrate as far as said covering element;
said filler material being separated from the component to be protected;
said filler material including substances dissolved in said filler material under a positive pressure and liberated again when the pressure is reduced for surrounding the component to be protected with a fluid to achieve necessary pressure changes, and said filler material being a foamed polymer; and
said expanded filler material being located on the surface of the substrate to prevent an excessive force from being exerted to the component to be protected.

* * * * *